United States Patent
Wu

(10) Patent No.: US 11,355,725 B2
(45) Date of Patent: Jun. 7, 2022

(54) COMPOSITE THIN FILM AND FORMATION METHOD AND APPLICATION THEREOF

(71) Applicant: TCL TECHNOLOGY GROUP CORPORATION, Huizhou (CN)

(72) Inventor: Longjia Wu, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 233 days.

(21) Appl. No.: 16/909,152

(22) Filed: Jun. 23, 2020

(65) Prior Publication Data

US 2020/0321545 A1 Oct. 8, 2020

Related U.S. Application Data

(63) Continuation of application No. PCT/CN2018/121478, filed on Dec. 17, 2018.

(30) Foreign Application Priority Data

Dec. 29, 2017 (CN) .......................... 201711479579.4

(51) Int. Cl.
*H01L 51/50* (2006.01)
*C01G 9/02* (2006.01)
*B82Y 20/00* (2011.01)
*B82Y 30/00* (2011.01)
*B82Y 40/00* (2011.01)

(52) U.S. Cl.
CPC .............. *H01L 51/508* (2013.01); *C01G 9/02* (2013.01); *H01L 51/502* (2013.01); *H01L 51/504* (2013.01); *B82Y 20/00* (2013.01); *B82Y 30/00* (2013.01); *B82Y 40/00* (2013.01); *C01P 2004/64* (2013.01); *C01P 2004/86* (2013.01); *H01L 2251/308* (2013.01); *H01L 2251/558* (2013.01)

(58) Field of Classification Search
CPC ... H01L 51/508; H01L 51/502; H01L 51/504; H01L 2251/308; H01L 2251/558; B82Y 20/00; B82Y 30/00; B82Y 40/00; C01P 2004/64
USPC ................................................. 257/40, 79, 97
See application file for complete search history.

(56) References Cited

U.S. PATENT DOCUMENTS

| 10,600,980 B1* | 3/2020 | Boardman .......... H01L 51/5221 |
| 2012/0018707 A1 | 1/2012 | Lee et al. |
| 2019/0280235 A1* | 9/2019 | Kim .................... H01L 51/0067 |

(Continued)

FOREIGN PATENT DOCUMENTS

| CN | 105977393 A | 9/2016 |
| CN | 106654026 A | 5/2017 |
| CN | 107099190 A | 8/2017 |

OTHER PUBLICATIONS

World Inteli Fctual Property Organization (WIPO) International Search Report for PCT/CN2018/121478 dated Mar. 12, 2019 5 Pages.

*Primary Examiner* — David Vu
*Assistant Examiner* — Brandon C Fox
(74) *Attorney, Agent, or Firm* — Anova Law Group, PLLC

(57) ABSTRACT

A composite thin film includes N thin film layers stacked one over another in sequence from a first thin film layer to an N-th thin film layer. N is an integer satisfying $3 \leq N \leq 9$. The N thin film layers are nano-ZnO thin films. A nano-ZnO particle size of the nano-ZnO thin films gradually increases or decreases from the first thin film layer to the N-th thin film layer.

20 Claims, 1 Drawing Sheet

(56) References Cited

U.S. PATENT DOCUMENTS

2020/0411719 A1* 12/2020 Kimoto ................ H01L 33/06
2020/0411785 A1* 12/2020 Kanehiro .............. C09K 11/08
2021/0020858 A1*  1/2021 Qin ..................... C09K 11/54
2021/0151629 A1*  5/2021 Boardman ............. H01L 33/40

* cited by examiner

COMPOSITE THIN FILM AND FORMATION METHOD AND APPLICATION THEREOF

CROSS-REFERENCE TO RELATED APPLICATIONS

This application is a continuation of International Application No. PCT/CN2018/121478, filed Dec. 17, 2018, which claims priority to Chinese Application No. 201711479579.4 filed Dec. 29, 2017, the entire contents of both of which are incorporated herein by reference.

TECHNICAL FIELD

The present disclosure relates to the display technology field and, more particularly, to a composite thin film and formation method and application thereof.

BACKGROUND

Nowadays, with the display technology continues to progress, quantum dot light-emitting diode (QLED) with quantum dot material as light-emitting layer has huge application prospects. The properties of quantum dot (QD) material include high luminous efficiency, controllable luminescent color, high color purity, good device stability, capability for flexible applications, etc. Due to these properties, QLED has received more and more attention in the fields of display technology and solid-state lighting.

A nano zinc oxide (nano-ZnO) electron transport layer (ETL) formed by depositing using ZnO colloid solution has gradually become commonly used in QLEDs. In one respect, nano-ZnO ETL has excellent electron transport capability with electron mobility above $10^{-3}$ cm$^2$/V·s. In another respect, nano-ZnO has a good energy level matching with cathode and QD light-emitting layer, especially red QD light-emitting layer. The good energy matching significantly reduces the injection barrier for electrons from the cathode to the QD light-emitting layer. A deeper valence band energy level of the nano-ZnO ETL can effectively block holes. These properties make the nano-ZnO ETL the first choice for a QLED device, which can significantly improve the stability and luminous efficiency of the device.

Though the nano-ZnO material has brought excellent performance to the QLED, some problems still need to be solved in a practical application of this material. For example, when the QLED is applied to the display technology, as the basic unit of color rendering, the QLED needs to be able to emit red, green, and blue colors. The display technology requires the use of red, green, and blue QLEDs including red, green, and blue QD light-emitting layers, respectively. When the nano-ZnO ETL is applied to the red, green, and blue QLEDs, the electron injection efficiencies of the different colored light-emitting diodes are also different. As the described above, the nano-ZnO ETL has an excellent energy level matching with the red QD light-emitting layer. The energy levels of the conduction band of the nano-ZnO ETL and the QD light-emitting layer are very close to each other. Therefore, the red QLED has an excellent electron injection efficiency. In the green and blue QLEDs, the conduction band energy level of the QD light-emitting layer increases as a light-emitting wavelength moves toward a short wavelength, and the electron injection barrier between the QD light-emitting layer and the nano-ZnO ETL also increases (as shown in FIG. 1). For the blue color QLED, the conduction band energy level of the blue QD light-emitting layer is significantly higher than the conduction band energy level of the nano-ZnO ETL, which significantly increases the electron injection barrier of the QLED. As such, the electron injection efficiency of the QLED device is reduced. To resolve this problem, more and more researchers tried to use metal ion-doped nano-ZnO to increase the conduction band energy level of nano-ZnO ETL. However, this method also has some problems. In one respect, although the metal ion-doped nano-ZnO can increase the conduction band energy level of the nano-ZnO ETL to reduce the electron injection efficiency between the nano-ZnO ETL and the QD light-emitting layer, a new injection barrier may be created between the nano-ZnO ETL and the cathode after the conduction band energy level is increased. This makes it difficult to radically improve the electron injection efficiency of the QLED devices. In addition, while the metal ion-doped ZnO method can increase the conduction band energy level of the ZnO ETL, the method may also cause the valence band of the ZnO ETL to become shallower. As such, the hole blocking function may be lost, which can severely damage the device performance of the QLED devices.

SUMMARY

In accordance with the disclosure, there is provided a composite thin film including N thin film layers stacked one over another in sequence from a first thin film layer to an N-th thin film layer. N is an integer satisfying 3≤N≤9. The N thin film layers are nano-ZnO thin films. A nano-ZnO particle size of the nano-ZnO thin films gradually increases or decreases from the first thin film layer to the N-th thin film layer.

Also in accordance with the disclosure, there is provided a method for forming a composite thin film including preparing N ZnO colloid solutions with different nano-ZnO particle sizes using mixed solutions of zinc salt and alkali, and depositing the ZnO colloid solutions over a substrate in an order of increasing or decreasing nano-ZnO particle size to form the composite thin film including N nano-ZnO thin films with the nano-ZnO particle size gradually increasing or gradually decreasing. N is an integer satisfying 3≤N≤9.

Also in accordance with the disclosure, there is provided a light-emitting device including an anode and a cathode, and a light-emitting layer and an electron transport layer (ETL) stacked one over another and arranged between the anode and the cathode. The ETL is close to the cathode, and the light-emitting layer is close to the anode. The ETL includes a composite thin film including N thin film layers stacked one over another. N is an integer satisfying 3≤N≤9. The N thin film layers are nano-ZnO thin films. A nano-ZnO particle size of the nano-ZnO thin films increases gradually along a direction from the light-emitting layer to the cathode from a first thin film layer close to the light-emitting layer to an N-th thin film layer close to the cathode.

DETAILED DESCRIPTION OF THE EMBODIMENTS

Figure 1:
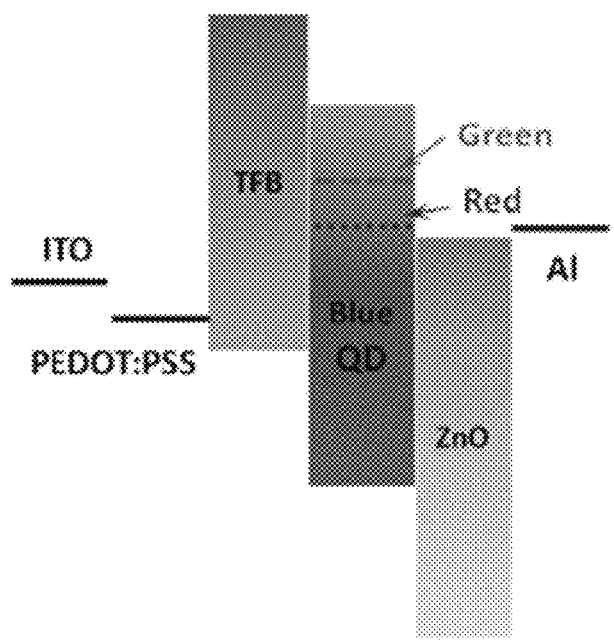
FIG. 1 illustrates a schematic diagram of energy levels of red, green, and blue QLEDs.

To make the objectives, technical solutions, and advantages clearer, the present disclosure is further described in detail below in connection with the accompanying drawings and embodiments. Specific embodiments described herein are merely intended to explain the present disclosure and are not intended to limit the present disclosure.

In the present disclosure, the terms "first" and "second" used here are only for descriptive purposes and are not considered to indicate or imply relative importance or imply a number of technical features. The description of a feature with "first" and "second" may indicate or imply including one or more of the feature. For the description of the present disclosure, "a plurality of" means two or more, unless otherwise specified.

Due to the quantum confinement effect, a change in a particle radius of nano-ZnO particles can directly change a forbidden band width of a nano-ZnO material. The smaller the particle size is, the wider the forbidden band width of the nano-ZnO material is. However, as the forbidden band width increases, the conduction band energy level of the nano-ZnO material is increased, and the valence band energy level becomes deeper. Therefore, a gradual change of sizes of the nanoparticles of the nano-ZnO ETL causes the nano-ZnO ETL to have a gradually increasing conduction band energy level and a deepening valence band energy level.

Embodiments of the present disclosure provide a composite thin film. The composite thin film includes N layers of thin films stacked one over another in sequence (N is a positive integer). The N layers of thin films are nano-ZnO thin films (the composite thin film is a nano-ZnO composite thin film formed by multi-layer nano-ZnO thin films). The nano-ZnO particle sizes of the nano-ZnO thin films gradually increase from a first layer to an N-th layer, where a range of N is $3 \leq N \leq 9$.

The composite thin film according to embodiments of the present disclosure uses nano-ZnO as a constituent substance, and the composite thin film includes N layers of thin films with a gradually increasing nano-ZnO particle size layer by layer. As such, a composite thin film including nano-ZnO with gradually increasing conduction band energy level and gradually deepening valence band energy level can be obtained without the need to dope other metal ions into the nano-ZnO. Since the composite thin film has a gradually increasing conduction band energy level, when the composite thin film is used as an ETL of a blue QLED or a green QLED, the composite thin film has a good matching relationship with the cathode and the blue QD light-emitting layer or the green QD light-emitting layer. The good energy matching solves the problem of high electron injection barrier in blue or green quantum QLED devices. At the same time, the valence band energy level of the composite thin film is gradually deepened, which further increases a blocking effect of the ZnO ETL on holes, and significantly improves the luminous efficiency and device performance of the QLED device. In addition, for the composite thin film consistent with the disclosure, there is no need to introduce any other organic compound or inorganic compound as a dopant for the ZnO material, such that no risk of introducing impurities exists. Further, when the composite thin film is used as the ETL of the light-emitting device, the composite thin film does not need to undergo any complicated processing process, which is beneficial to simplify the process and reduce cost.

In some embodiments, for the nano-ZnO composite thin film with gradually increasing nano-ZnO particle size layer by layer, a maximum nano-ZnO particle size should ensure a good energy level matching relationship between the nano-ZnO material with the largest particle size and the cathode energy level. When the particle size of the largest nano-ZnO particle is too small, the small size nano-ZnO will cause the conduction band level of the nano-ZnO with the largest particle size to rise too high, and the electron injection barrier is generated between the nano-ZnO composite thin film and the cathode energy level. When the particle size of the largest nano-ZnO particle is too large, required temperature for synthesizing the particle is too high. The high synthesized temperature can cause the nanoparticles (NPs) to have poor dispersion and severe agglomeration, which affect a later film formation from the ZnO colloid solution. In some embodiments, in the nano-ZnO thin film with the largest particle size, i.e., the N-th thin film layer, the nano-ZnO particle size is 8-10 nm, and a reaction temperature used for forming this film is 70-90° C.

The minimum particle size of nano-ZnO should ensure that it can significantly increase the conduction band energy level of the nano-ZnO material to be close to the conduction band energy level of the blue QD light-emitting layer or the green QD light-emitting layer, so as to reduce the electron injection barrier between ETL and the QD light-emitting layer as much as possible. When the particle size of the smallest nano-ZnO particle is too large, an increase of the conduction band energy level of the nano-ZnO material with the smallest particle size may be insufficient, resulting in a large electron injection barrier between the conduction band energy level of the blue QD light-emitting layer or the green QD light-emitting layer. As a result, the electrons injection efficiency of the blue QLED or green QLED device cannot be fundamentally improved. On the other hand, when the particle size of the smallest nano-ZnO particle is too small, a required temperature for synthesizing the small size particle is too low. The low synthesized temperature can significantly slow down the formation of the nanoparticles, and the crystallinity of the formed nano-ZnO particles is also poor. In some embodiments, in the nano-ZnO thin film with the smallest particle size, i.e., the first layer of the composite thin film, the nano-ZnO particle size is 2-3 nm, and the reaction temperature used for forming this film is 0-10° C.

In a composite thin film with the nano-ZnO particle size of the nano-ZnO thin film increasing layer by layer, the nano-ZnO particle size increases gradually from the above-mentioned smallest particle size to the above-mentioned largest particle size. The gradually increasing particle size greatly reduces a difference between the conduction energy levels of the film layers to facilitate the electrons to migrate smoothly in the nano-ZnO composite thin film with the gradually increasing conduction energy level.

A number of the nano-ZnO thin film layers is a parameter that can determine whether the electrons can migrate smoothly in the nano-ZnO composite thin film. In some embodiments, N can be in the range of 3 and the nano-ZnO particle size increases from the smallest to the largest particle size layer by layer. When the number of the nano-ZnO thin film layers is too small, a difference between the nano-ZnO particle sizes of the film layers may be relatively large. The large difference means the difference between the conduction band energy levels of the film layers may also be large. The large difference of the conduction band energy levels may cause the nano-ZnO composite thin film to have a relatively large electron mitigation barrier, which affects the smooth migration of electrons in the nano-ZnO composite thin film. When the number of the nano-ZnO thin film layers is too large, a thickness of the nano-ZnO composite thin film may be too large. The thicker composite thin film can block the injection of the electrons, which can affect a carrier injection balance. In some embodiments, N is in a range of 5 and the nano-ZnO particle size increases from the smallest particle size to the largest particle size layer by layer.

In some embodiments, in the composite thin film, a thickness of a single nano-ZnO layer is in a range of 10 to 20 nm. The total thickness of the composite thin film is 30-180 nm. When the total thickness of the composite thin film is less than 30 nm, the composite thin film used as an ETL is easy to be broken down by the electrons, and cannot guarantee a carrier injection performance. When the total thickness of the composite thin film is more than 180 nm, the composite thin film used as the ETL may block the electron injection, and affect a charge injection balance. In some embodiments, when the composite thin film has 5 to 7 layers, the total thickness of the composite thin film correspondingly is 50-140 nm.

The composite thin film provided by embodiments of the present disclosure can be formed by the following method.

Correspondingly, a formation method for a composite thin film includes the following processes.

At S01, a mixed solution of zinc salts and alkalis is provided to prepare ZnO colloid solutions with different nano-ZnO particle sizes.

At S02, a substrate is provided. The ZnO colloid solutions are deposited on the substrate in a sequence from small to large or from larger to small according to the nano-ZnO particle sizes of the ZnO colloid solutions, to form N layers of nano-ZnO films having the nano-ZnO particle size gradually increasing or gradually decreasing, so as to obtain the composite thin film. N is in a range of $3 \leq N \leq 9$.

The formation method of the composite thin film provided by embodiments of the present disclosure is a low-temperature solution method, which includes preparing the ZnO colloid solutions with different nano-ZnO particle sizes and depositing the solutions in sequence to form the nano-ZnO composite thin film with the gradually increasing conduction band energy level and the gradually deepening valence band energy level. The film formed by this method can realize the two functions of improving the electron injection efficiency in the blue QLED or green QLED devices and enhancing a hole blocking function of the ZnO ETL. This formation method has strong applicability and practicality and can significantly improve the luminous efficiency and device performance of QLED devices. In addition, the method has a low requirement for equipment. When the ZnO colloid solutions are prepared, no other organic compound or inorganic compound needs to be introduced as a dopant for the ZnO material, such that there is no risk of introducing impurities. Therefore, when the nano-ZnO composite thin film is used as an ETL of a light-emitting device, no complicated processing process needs to be performed. The operation process is simple, the cost is low, and the process has good repeatability. The prepared ZnO colloid solution has excellent monodispersity and stability.

In some embodiments, at S01, the mixed solution of zinc salt and alkali is formed by dissolving the zinc salt and alkali in a solvent.

The zinc salt is used as a zinc source, which provides Zn for forming the nano-ZnO thin film. In some embodiments, the zinc salt includes but is not limited to one or more of zinc acetate ($ZnC_4H_6O_4$) and its hydrate, zinc nitrate ($Zn(NO_3)_2$) and its hydrate, zinc sulfate ($ZnSO_4$) and its hydrate, and zinc chloride ($ZnCl_2$) and its hydrate.

In some embodiments, the reaction process of forming the ZnO colloid solutions with different nano-ZnO particle sizes using the mixed solution of zinc salt and alkali is as follows. The zinc salt solution reacts with the alkali solution to form zinc hydroxide intermediates, followed by zinc hydroxide intermediates condensation reaction to gradually form nano-ZnO particles. In a reaction system, the alkali provides hydroxide ions ($OH^-$) for the reaction and plays an important role. In some embodiments, the alkali includes at least one of lithium hydroxide (LiOH), sodium hydroxide (NaOH), potassium hydroxide (KOH), TMAH, ammonia ($NH_3OH$), ethanolamine ($C_2H_7NO$), or ethylenediamine ($C_2H_8N_2$).

In some embodiments, the solvent used to form the mixed solution of zinc salt and alkali may be an organic solvent or an inorganic solvent. The solvent may include but not limited to at least one of water, methanol, ethanol, propanol, butanol, ethylene glycol, ethylene glycol monomethyl ether, or dimethyl sulfoxide (DMSO).

The mixed solution of zinc salt and alkali according to embodiments of the present disclosure may be prepared by adding the zinc salt and alkali into the solvent. In some embodiments, the preparation method of the mixed solution of zinc salt and alkali is as follows. The zinc salt is dissolved in a solvent to obtain the salt solution. The alkali is dissolved in the same or a different solvent to obtain the alkali solution. Then the salt solution and the alkali solution are mixed to obtain the mixed solution. All the processes can be done under room temperature (10-30° C.).

In some embodiments, in the mixed solution, the molar ratio of $OH^-$ to metal ions is 1.5:1-2.5:1 to ensure the formation of the doped nano-ZnO particles and reduce the generation of reaction by-products. When the molar ratio of $OH^-$ to metal ions is smaller than 1.5:1, the metal salt is too much, so that a large quantity of metal salts is unable to form nano-ZnO particles. When the molar ratio of $OH^-$ to metal ions is larger than 2.5:1, the alkali is too much, so that the excessive $OH^-$ may form stable complexes with the hydroxide intermediates and hence the hydroxide intermediates are unable to condense to form nano-ZnO particles. In some embodiments, in the mixed solution, the molar ratio of $OH^-$ to metal ions is 1.5:1-2:1.

In some embodiments, the method of obtaining the metal ion-doped ZnO colloid solution is carried out by reacting the mixed solution at 0-90° C. for 30-240 min to prepare the ZnO colloid solution. The above-mentioned temperatures can ensure the formation of the nano-ZnO particles and obtain a good particle dispersion. The above-mentioned temperature also can provide a sufficient temperature range for significant changes of nano-ZnO particle sizes. When the reaction temperature is lower than 0° C., the excessive low temperature can significantly reduce the formation of the nano-ZnO particles, or even prevent the formation of the nano-ZnO particles, resulting in only hydroxide intermediates. When the reaction temperature is higher than 90° C., the obtained nano-ZnO particles have poor dispersion and severe agglomeration, which affect the later film formation from the doped ZnO colloid solution. Further, the reaction duration is 30-240 min to ensure the formation of the doped nano-ZnO particles and to control the particle sizes. When the reaction duration is shorter than 30 min, the reaction duration is too short that the nano-ZnO particles are not sufficiently formed, and the formed nano-ZnO particles have poor crystalline. When the reaction duration is longer than 4 h, the reaction duration is too long which makes the formed nano-ZnO particles too large and the particle size is not uniform, which affect the later film formation from the ZnO colloid solution. In some embodiments, the reaction duration is 1~2 h.

Further, after the reaction ends, a precipitant is added to the reaction solution after the reaction and a white precipitate is formed in the mixed solution (precipitation process). After a centrifugal treatment, the metal ions doped nano-ZnO particles are obtained. The volume ratio of the precipitant to the reaction system solution is 2:1~6:1 to prevent the excessive precipitant from damaging the solubility of the doped ZnO particles while the metal ions doped nano-ZnO particles are sufficiently precipitated. In some embodiments, the volume ratio of the precipitant to the reaction system solution is 3:1~5:1. The precipitant is one of the less polar solvents, including but not limited to ethyl acetate, n-hexane, n-heptane, acetone, etc. The white precipitate obtained by the centrifugal treatment is dissolved in the reaction solvent again to be repeatedly cleaned several times to remove reactants not involved in the reaction. The final white precipitate is collected, which can be solved in the solvent to obtain the ZnO colloid solution doped with unequal metal ions having a large ionic radius, that is, the nano-ZnO particle colloid solutions that contain doping metal ions.

Embodiments of the present disclosure provide a low-temperature solution method for forming the ZnO colloid solution. In the whole reaction process of low-temperature solution method (zinc salt reacts with alkali to form hydroxide intermediates, followed by the condensation reaction of hydroxide intermediates to gradually generate the nano-ZnO particles), the formation of the nano-ZnO particles occurs in a liquid phase. The low-temperature solution method for preparing the ZnO colloid solutions consistent with embodiments of the disclosure is very simple, the cost is low, the operation is easy, the requirements on the equipment are low, and the repeatability is good. The low-temperature solution method may be a low-temperature alcoholysis method (using alcohol as solvent) or a low-temperature hydrolysis method (using water as solvent).

Based on the preparation method of the ZnO colloid solution, embodiments of the disclosure also provide a method for preparing a plurality of ZnO colloid solutions with gradually changing nano-ZnO particle size, for forming a nano-ZnO composite thin film with gradually increasing conduction band energy level and gradually deepening valence band energy level. The adjustment of the nanoparticle sizes is achieved by controlling the reaction temperature of the low-temperature solution method. Embodiments of the present disclosure provide a mixed solution of zinc salt and alkali to prepare the ZnO colloid solutions with different nano-ZnO particle sizes. The reaction temperature of the mixed solution of zinc salt and alkali is changed to form the ZnO colloid solutions with different nano-ZnO particle sizes. The reaction temperature ranges from 0 to 90° C.

According to the above-described basis for selecting nano-ZnO particle sizes in the composite thin film, in some embodiments, the smallest nano-ZnO particle size of the ZnO colloid solutions is 2-3 nm. The largest nano-ZnO particle size of the ZnO colloid solutions is 8-10 nm. The reaction temperature corresponding to the largest nano-ZnO particle size of 8-10 nm is 70~90° C. The reaction temperature corresponding to the smallest nano-ZnO particle size of 2-3 nm is 0~10° C. That is, the reaction temperature for forming the ZnO colloid solution with the smallest particle size is 0~10° C., and the reaction temperature for forming the ZnO colloid solution with the largest particle size is 70-90° C.

To obtain a nano-ZnO composite thin film with the gradually increasing conduction band energy level and the gradually deepening valence band energy level, during the preparation process, different reaction temperatures can be used to adjust the particle size of the nano-ZnO particles. In some embodiments, the number of ZnO colloid solutions with gradually changing nanoparticle sizes consistent with embodiments of the present disclosure is 3-9. The nanoparticle size of the ZnO colloid solutions increases gradually from the above-mentioned minimum size to the above-mentioned maximum size. The corresponding reaction temperature for preparing the ZnO colloid solutions also increases gradually from the lowest reaction temperature (0-10° C.) to the highest reaction temperature (70-90° C.).

In some embodiments, at S02, the ZnO colloid solutions are deposited on the substrate. The selection of the substrate is not strictly limited. The substrate can be a normal substrate for depositing the composite thin film. The substrate may also be a functional substrate that is deposited with other functional layers and requires further deposition of electron transport films. For example, the substrate can be a functional substrate with stacked anode and light-emitting layer deposited thereover, and the composite thin film is deposited over the light-emitting layer.

The deposit method is not strictly limited. The deposition method can be the solution processing method which is based on the colloid properties of the nano-ZnO colloid solution. In some embodiments, the deposition method includes but is not limited to one of the spin-coating, scratch-coating, printing, spraying, roller-coating, electrodeposition methods, etc.

When the plurality of ZnO colloid solutions with different nano-ZnO particle sizes are deposited, the ZnO colloid solution with the smallest nano-ZnO particle size is first deposited on the substrate. Subsequently, the ZnO colloid solutions are deposited in the order of increasing nano-ZnO particle sizes. Finally, the ZnO colloid solution with the largest ZnO particle size is deposited. In some embodiments, when the plurality of ZnO colloid solutions with different nano-ZnO particle sizes are deposited, the ZnO colloid solution with the largest nano-ZnO particle size is first deposited on the substrate. Subsequently, the ZnO colloid solutions are deposited in the order of decreasing nano-ZnO particle sizes. Finally, the ZnO colloid solution with the smallest ZnO particle size is deposited. The formed composite thin film can be used in a light-emitting device, especially the blue QLED device or green QLED device. If the QLED device includes a normal blue QLED or green QLED, then when the plurality of ZnO colloid solutions with different nano-ZnO particle sizes are deposited, the ZnO colloid solution with the smallest ZnO particle size is first deposited on a substrate having an anode, a hole transport layer, a blue or green QD light-emitting layer. Subsequently, the ZnO colloid solutions are deposited in the order of increasing nano-ZnO particle sizes. Finally, the ZnO colloid solution with the largest ZnO particle size is deposited. If the QLED device includes an inverted blue QLED or green QLED, then when the plurality of ZnO colloid solutions with different nano-ZnO particle sizes are deposited, the ZnO colloid solution with the largest ZnO particle size is first deposited on a substrate having a cathode. Subsequently, the ZnO colloid solutions are deposited in the order of decreasing nano-ZnO particle sizes. Finally, the ZnO colloid solution with the smallest ZnO particle size is deposited.

In some embodiments, the simple low-temperature solution method is used to prepare a plurality of doped-ZnO colloid solutions with gradually increasing conduction band energy level and gradually deepening valence band energy level. Subsequently, the ZnO colloid solutions are deposited in a certain sequence on the substrate, and the substrate with the deposition is heat treated. As such, the nano-ZnO composite thin film with the gradually increasing conduction band energy level and the gradually deepening valence band energy level is formed. Since the nano-ZnO composite thin film has the gradually increasing conduction band energy level, a good energy matching relationship exists between the ETL and the cathode and between the ETL and the blue or green light-emitting layer, and the problem of high electron injection barrier in the blue or green QLED device can be solved. At the same time, the valence band energy level of the composite thin film is gradually deepened, which further increases the blocking effect of the ZnO ETL on the holes. As a result, the luminous efficiency and device performance of the QLED device are significantly improved.

Embodiments provide a light-emitting device including an anode and a cathode. The light-emitting device also includes a light-emitting layer and an ETL stacked one over another between the anode and the cathode. The ETL is close to the cathode, and the light-emitting layer is close to the anode. The ETL is the above-described composite thin film. In some embodiments, the ETL is a composite thin film formed by the above-described method. The nano-ZnO particle size of the composite thin film increases gradually along a direction from the light-emitting layer to the cathode from the first thin film layer to the N-th thin film layer.

The light-emitting device provided by embodiments of the present disclosure includes the composite thin film. Therefore, the luminous efficiency and the device performance of the light-emitting device can be significantly improved.

In some embodiments, the light-emitting layer can be an organic light-emitting layer, or a QD light-emitting layer. Correspondingly, when the light-emitting layer is an organic light-emitting layer, the LED is an organic light-emitting diode (OLED) device. When the light-emitting layer is a QD layer, the LED is a QLED device.

In some embodiments, the light-emitting device includes a blue QD light-emitting device or a green QD light-emitting device. The light-emitting device includes a blue or green QD light-emitting layer, an ETL, and a cathode stacked one over another. The ETL is the above-described composited thin film.

One side of the composite thin film that contacts the cathode has the largest nano-ZnO particle size. Therefore, the ETL on this side has the lowest conduction band energy level which is close to the energy level of the cathode. The side of the composite thin film in contact with the blue QD light-emitting layer or the green QD light-emitting layer has the smallest nano-ZnO particle size. Therefore, the ETL at this side has the highest conduction band energy level which is close to that of the QD light-emitting layer. Between the two sides of the composite thin film, the particle size of the nano-ZnO particles gradually changes, which means that the conduction band energy level of the nano-ZnO ETL gradually changes. As such, the barriers when the electrons migrate in the transport layer are also reduced to the greatest extent. This energy level structure can ensure a good energy level matching relationship between the ETL and cathode, as well as between the ETL and the blue QD light-emitting layer or green QD light-emitting layer. In addition, the continuous energy level change within the ZnO ETL can ensure the electrons to migrate smoothly in the transport layer, allowing the ZnO ETL with the gradually increasing conduction band energy level to minimize the electron injection barriers in the blue or green QLEDs. Similarly, the valence band energy level of the nano-ZnO ETL can also gradually deepen according to some embodiments of the present disclosure. The side of the composite thin film in contact with the blue QD light-emitting layer or the green QD light-emitting layer has the deepest valent band energy level, which can further improve the hole blocking function of the ZnO ETL. In summary, in embodiments of the present disclosure, the nano-ZnO ETL with a gradually increasing conduction band energy level and a gradually deepening valence band energy level is applied to the blue or green QLED device, which can significantly improve the luminous efficiency and device performance of the QLED device.

Figure 2:
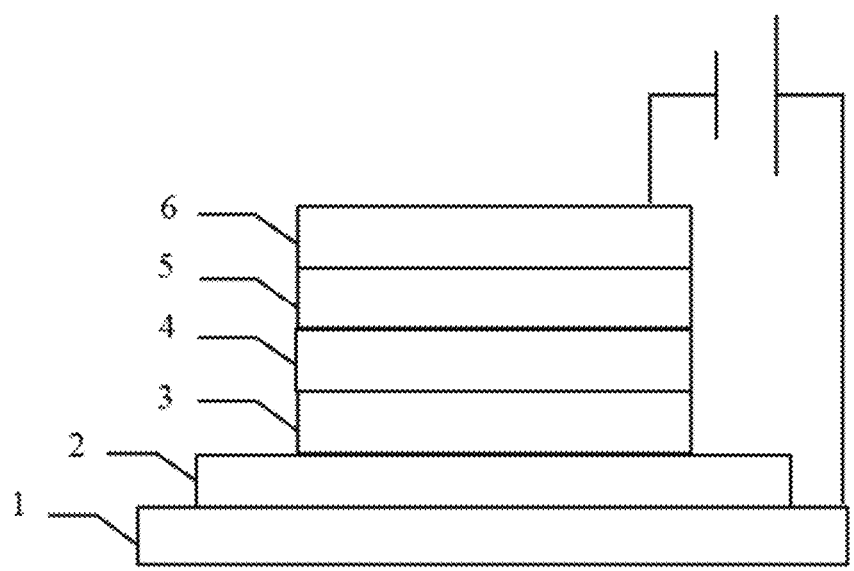
FIG. 2 is a schematic structural diagram of a QLED according to some embodiments of the present disclosure.

In some embodiments, as shown in FIG. 2, the light-emitting device includes a substrate 1, and an anode 2, a hole transport layer (HTL) 3, a blue or green QD light-emitting layer 4, an ETL 5, and a cathode 6 stacked one over another and over the substrate 1. The ETL 5 is the above-described composite thin film. Along the direction from the cathode 6 to the blue or green QD light-emitting layer 4, the nano-ZnO particle size of the composite thin film decreases layer by layer.

In some embodiments, the substrate 1 may include a hard substrate or a soft substrate. In some embodiments, the substrate may include a glass substrate.

The anode 2 may include indium tin oxide (ITO), but is not limited to this.

The HTL 3 can include any conventional hole transport material in the field, which includes but is not limited to TFB (poly(9,9-dioctylfluorene-co-N-(4-(3-methylpropyl))diphenylamine), PVK (poly(N-vinyl carbazole)), Poly-TPD (poly (N,N'-bis(4-butylphenyl)-N,N'-bis(phenyl)-benzidine)), TCTA (tris(4-carbazoyl-9-ylphenyl)amine), CBP (4,4'-Bis (N-carbazolyl)-1,1'-biphenyl), etc., or any combination thereof, or may include another high-performance hole transport material.

The QDs of the blue or green QD light-emitting layer 4 can be one of the green or blue QDs. In some embodiments, the QDs may include at least one of CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe, a core-shell structured QD, or an alloy QD. The QDs may also include any of the common green or blue QDs. The QDs may or may not contain Cd. In some embodiments, the thickness of the light-emitting layer is 20-60 nm.

The ETL 5 includes the above-mentioned composite thin film.

The cathode includes a metal cathode material such as silver (Ag) or aluminum (Al), or Ag nanowire or Cu nanowire. The Ag nanowires or Cu nanowires have low resistance, which facilitates the smooth injection of carriers. In some embodiments, the thickness of the cathode is 15-30 nm.

Further, the obtained light-emitting device can be packaged.

Correspondingly, embodiments of the present disclosure provide a formation method of a light-emitting device, including the following processes.

At Q01, a light-emitting layer is formed over an anode.

In some embodiments, the solution method can be used to obtain the light-emitting layer. That is, the light-emitting layer material is first dissolved in a solvent to make a light-emitting material solution. Then, the light-emitting layer material solution is deposited over the anode surface. In some embodiments, the light-emitting layer material solution may be deposited to form a film by a spin-coating method. In some embodiments, the anode substrate is placed on a homogenizer, the light-emitting layer material solution with a certain concentration is then spin-coated over the anode substrate to form a film. The thickness of the light-emitting layer can be adjusted by adjusting the concentration of the solution, spin-coating speed, and spin-coating time. Then, a heat annealing treatment is performed at an appropriate temperature.

In some embodiments, before the formation of the light-emitting layer, the HTL can be formed over the anode.

The same formation method for the light-emitting layer may be applied to form the HTL, which is the solution processing method, such as spin-coating method. The thickness of the HTL may further be adjusted by adjusting the concentration of the solution, spin-coating speed, and spin-coating time. Then, a heat annealing treatment is performed at an appropriate temperature.

At Q02, an ETL is formed over the light-emitting layer.

The ETL is formed over the light-emitting layer by the above-described method of forming the composite thin film, which is not be repeated here. When the composite thin film is being formed, the nano-ZnO particle size of the composite thin film is reduced layer by layer along the direction from the cathode to the light-emitting layer.

At Q03, a cathode is formed over the ETL.

In some embodiments, the substrate with the deposited functional layers is placed in an evaporation chamber, and the cathode is formed by thermal evaporation through a mask plate.

Further, the device is packaged under conditions of less than 0.1 ppm of both oxygen and water to ensure device stability.

In some embodiments, the LED can also be formed by another formation method, including the following processes.

At Q01, an ETL is formed over the cathode.

At Q02, a light-emitting layer is formed over the ETL.

At Q03, an anode is formed over the light-emitting layer.

Each layer can be formed using the same method as described above. When the composite thin film is being formed, the nano-ZnO particle size of the composite thin film is reduced layer by layer along the direction from the cathode to the light-emitting layer.

The following is a description with reference to specific embodiments.

In some embodiments, a formation method of a nano-ZnO composite thin film includes the following processes.

First, an appropriate amount of zinc acetate is added to 50 ml ethanol solvent to form a zinc salt solution with a total concentration of 0.1 mol/L. Further, an appropriate amount of LiOH powder is dissolved in another 50 ml ethanol solvent to form an alkaline solution with a concentration of 0.2 mol/L. The zinc salt solution is then cooled to 0° C. and the LiOH solution is added drop by drop until the molar ratio of $OH^-$ root ions to zinc ions is 1.7:1. After the dripping of the LiOH solution, the mixed solution is stirred at 0° C. for 1 h to obtain a uniform transparent solution. Subsequently, a heptane solvent with a volume ratio of 3:1 is added to the uniform transparent solution, resulting in a large amount of white precipitate in the transparent solution. The turbid solution is centrifuged at 7000 rpm. The obtained white precipitate is then dissolved again in an ethanol solvent. This cleaning process is repeated four times. The final resulting white precipitate is dissolved in an appropriate amount of ethanol solvent to obtain a ZnO colloid solution with a concentration of 30 mg/ml and the nanoparticle size of the colloid solution is 2.3 nm.

The above-mentioned method of preparing the ZnO colloid solution is repeated four times, where the reaction temperature is gradually increased to 10° C., 25° C., 50° C., and 70° C., while the remaining synthesis parameters are kept the same. Four ZnO colloid solutions with a solution concentration of 30 mg/ml and nanoparticle sizes of 2.8 nm, 3.5 nm, 5.8 nm, and 7.6 nm are obtained. The nanoparticle sizes of the above-mentioned five portions of the ZnO colloid solutions are measured from transmission electron microscopy (TEM) photographs. The conduction band energy level, valence band energy level, and forbidden band width of each ZnO colloid solution are measured using UV photoelectron spectroscopy (UPS) after each ZnO colloid solution has been individually formed into a film. The conduction band energy level, valence band energy level, and forbidden band width for each ZnO colloid solution in this embodiment are shown in Table 1.

The above-described five ZnO colloid solutions are deposited by spin-coating over a substrate with an anode, an HTL, and a blue or green QD light-emitting layer in the order of gradually increasing ZnO particle size. With the increase of the particle size of the nanoparticles, the spin-coating speed of the ZnO colloid solution is gradually increased to control the thickness of each nano-ZnO film to be around 20 nm. The spin-coating speeds for the five ZnO colloid solutions are 3000 rpm, 3000 rpm, 3500 rpm, 4000 rpm, and 5000 rpm, respectively, and the spin coating time is 30 s for all five ZnO colloid solutions. When all the five ZnO colloid solutions are deposited in sequence, a nano-ZnO ETL with a gradually increasing conduction band energy level and a gradually deepening valence band energy level is formed. The total thickness of the nano-ZnO ETL is around 100 nm.

TABLE 1

| Particle size (nm) | Conduction band energy level (eV) | Valence band energy level (eV) | Forbidden band width (eV) |
|---|---|---|---|
| 2.3 | −3.47 | −7.62 | 4.15 |
| 2.8 | −3.66 | −7.55 | 3.89 |
| 3.5 | −3.82 | −7.50 | 3.68 |
| 5.8 | −3.99 | −7.44 | 3.45 |
| 7.6 | −4.05 | −7.42 | 3.37 |

In some embodiments, a preparation method of the nano-ZnO composite thin film includes the following processes.

First, an appropriate amount of $Zn(NO_3)_2$ is added to 50 ml ethanol solvent to form a zinc salt solution with a total concentration of 0.1 mol/L. Further, an appropriate amount of NaOH powder is dissolved in another 50 ml ethanol solvent to form an alkaline solution with a concentration of 0.3 mol/L. The zinc salt solution is then cooled to 0° C. and the NaOH solution is added drop by drop until the molar ratio of $OH^-$ root ions to zinc ions is 2:1. After the dripping of the NaOH solution, the mixed solution is stirred at 0° C. for 2 h to obtain a uniform transparent solution. Subsequently, ethyl acetate with a volume ratio of 4:1 is added to the uniform transparent solution, resulting in a large amount of white precipitate in the transparent solution. The turbid solution is centrifuged at 7000 rpm. The obtained white precipitate is then dissolved again in an ethanol solvent. This cleaning process is repeated four times. The final resulting white precipitate is dissolved in an appropriate amount of ethanol solvent to obtain a ZnO colloid solution with a concentration of 30 mg/ml and the nanoparticle size of the colloid solution is 2.7 nm.

The above-mentioned method of forming ZnO colloid solution is repeated six times, wherein the reaction temperature is gradually increased to 5° C., 10° C., 20° C., 30° C., 50° C., and 70° C., while the remaining synthesis parameters are kept the same. Six ZnO colloid solutions with a solution concentration of 30 mg/ml and nanoparticle size of 3.2 nm, 3.9 nm, 4.8 nm, 6.1 nm, 6.9 nm, and 8.5 nm are obtained.

The nanoparticle sizes of the above-described seven ZnO colloid solutions are measured from TEM photographs.

The above-mentioned seven ZnO colloid solutions are deposited by spin-coating over a substrate with an anode, an HTL, and a blue or green QD light-emitting layer in the order of gradually increasing ZnO particle size. With the increase of the particle size of the nanoparticles, the spin-coating speed of the ZnO colloid solution is gradually increased to control the thickness of each nano-ZnO film to be around 20 nm. The spin-coating speeds for the seven ZnO colloid solutions are 3000 rpm, 3000 rpm, 3500 rpm, 3500 rpm, 4000 rpm, 4000 rpm, and 5000 rpm, respectively, and the spin coating time is 30 s for all seven ZnO colloid solutions. When all the seven ZnO colloid solutions are deposited in sequence, a nano-ZnO ETL with a gradually increasing conduction band energy level and a gradually deepening valence band energy level is formed. The total thickness of the nano-ZnO ETL is around 140 nm.

In some embodiments, a formation method a nano-ZnO composite thin film includes the following processes.

First, an appropriate amount of $ZnCl_2$ is added to 50 ml dimethyl sulfoxide (DMSO) solvent to form a zinc salt solution with a total concentration of 0.1 mol/L. Further, an appropriate amount of tetramethylammonium hydroxide (TMAH) powder is dissolved in another 50 ml ethanol solvent to form an alkaline solution with a concentration of 0.3 mol/L. The zinc salt solution is then cooled to 5° C. and the TMAH solution is added drop by drop until the molar ratio of $OH^-$ root ions to zinc ions is 1.5:1. After the dripping of the TMAH solution, the mixed solution is stirred at 5° C. for 2 h to obtain a uniform transparent solution. Subsequently, an N-hexane solvent with a volume ratio of 4:1 is added to the uniform transparent solution, resulting in a large amount of white precipitate in the transparent solution. The turbid solution is centrifuged at 7000 rpm. The obtained white precipitate is then dissolved again in an ethanol solvent. This cleaning process is repeated four times. The final resulting white precipitate is dissolved in an appropriate amount of ethanol solvent to obtain a ZnO colloid solution with a concentration of 30 mg/ml and the nanoparticle size of the colloid solution is 3.6 nm.

The above-mentioned method of preparing the ZnO colloid solution is repeated three times. The reaction temperature is gradually increased to 10° C., 25° C., and 80° C., while the remaining synthesis parameters are kept the same. Three ZnO colloid solutions with a solution concentration of 30 mg/ml and nanoparticle sizes of 4.5 nm, 5.9 nm, and 9.3 nm are obtained. The nanoparticle sizes of the above-mentioned seven ZnO colloid solutions are measured from TEM photographs.

The above-mentioned four ZnO colloid solutions are deposited by spin-coating over a substrate with an anode, an HTL, and a blue or green QD light-emitting layer in the order of gradually increasing ZnO particle size. With the increase of the particle size of the nanoparticles, the spin-coating speed of the ZnO colloid solution is gradually increased to control the thickness of each nano-ZnO film to be around 20 nm. The spin-coating speeds for the four ZnO colloid solutions are 3000 rpm, 3500 rpm, 4000 rpm, and 5000 rpm, respectively, and the spin coating time is 30 s for all four ZnO colloid solutions. When all the four ZnO colloid solutions are deposited in sequence, a nano-ZnO ETL with a gradually increasing conduction band energy level and a gradually deepening valence band energy level is formed. The total thickness of the nano-ZnO ETL is around 80 nm.

In some embodiments, a blue QLED or green QLED device includes a substrate, a cathode, an ETL, a blue or green QD light-emitting layer, an HTL, and an anode in a sequence from bottom to top. The substrate material may include glass. The cathode material may include ITO. The ETL material includes nano-ZnO material with gradually increasing conduction band energy level and gradually deepening valence band energy level. The HTL material includes TFB. The anode material includes aluminum (Al). The ETL is the above-described composite thin film. The nano-ZnO particle size in the composite thin film decreases layer by layer along the direction from the cathode to the light-emitting layer.

A formation method for the above-mentioned blue QLED or green QLED device includes the following processes.

First, the nano-ZnO ETL with a conduction band energy level gradually increasing and a valence band energy level gradually deepening is formed over the cathode.

The blue or green QD light-emitting layer is spin-coated over the ETL.

Finally, the HTL is deposited over the blue or green QD light-emitting layer, and the anode is formed over the HTL by evaporation. As a result, the blue or green QLED is obtained.

In some embodiments, a blue QLED or green QLED device includes a substrate, an anode, an HTL, a blue or green QD light-emitting layer, an ETL, and a cathode in a sequence from bottom to top. The substrate material may include glass. The cathode material may include ITO. The ETL material may include nano-ZnO material with gradually and continuously increasing conduction band energy level. The HTL material may include TFB. The anode material may include Al. The electron transport layer is the above-described composite thin film. The particle size of the nano-ZnO particles in the composite thin film decreases layer by layer along the direction from the cathode to the light-emitting layer.

A formation method for the above-mentioned blue QLED or green QLED device includes the following processes.

First, the HTL and the blue or green QD light-emitting layers are formed over the anode substrate in sequence.

The nano-ZnO ETL with a conduction band energy level gradually decreasing and a valence band energy level gradually shallowing is formed over the blue or green QD light-emitting layer.

Finally, the cathode is formed over the ETL by evaporation. As a result, the blue or green QLED is obtained.

The above-mentioned embodiments of the present disclosure are merely used to illustrate but not limit the technical solution of the present disclosure. Although the present disclosure is described in detail with reference to the above embodiments, those of ordinary skill in the art would understand that modifications may be made to the technical solution described in the above embodiments, or equivalent replacements may be made to some technical features. These modifications or replacements do not cause the essence of the corresponding technical solution to depart from the spirit and scope of the technical solutions of the embodiments of the present disclosure, and should be within the scope of the present disclosure.

What is claimed is:

1. A composite thin film comprising:
   N thin film layers stacked one over another in sequence from a first thin film layer to an N-th thin film layer, N being an integer satisfying $3 \leq N \leq 9$;

wherein:
the N thin film layers are nano-ZnO thin films; and
a nano-ZnO particle size of the nano-ZnO thin films gradually increases or decreases from the first thin film layer to the N-th thin film layer.

2. The composite thin film of claim 1, wherein $5 \leq N \leq 7$.

3. The composite thin film of claim 1, wherein the nano-ZnO particle size of the first thin film is 2-3 nm.

4. The composite thin film of claim 1, wherein the nano-ZnO particle size of the N-th thin film layer is 8-10 nm.

5. The composite thin film of claim 1, wherein a thickness of each of the nano-ZnO thin films is 10-20 nm.

6. The composite thin film of claim 1, wherein a total thickness of the composite thin film is 30-180 nm.

7. A method for forming a composite thin film comprising:
preparing N ZnO colloid solutions with different nano-ZnO particle sizes using mixed solutions of zinc salt and alkali, N being an integer satisfying $3 \leq N \leq 9$; and
depositing the ZnO colloid solutions over a substrate in an order of increasing or decreasing nano-ZnO particle size to form the composite thin film including N nano-ZnO thin films with the nano-ZnO particle size gradually increasing or gradually decreasing.

8. The method of claim 7, wherein:
a smallest nano-ZnO particle size of the ZnO colloid solutions is 2-3 nm, and
a largest nano-ZnO particle size of the ZnO colloid solutions is 8-10 nm.

9. The method of claim 7, wherein preparing the N ZnO colloid solutions with different nano-ZnO particle sizes using the mixed solutions of zinc salt and alkali includes:
changing a reaction temperature for the mixed solutions of zinc salt and alkali to prepare the ZnO colloid solutions with the different nano-ZnO particle sizes, the reaction temperature being changed within a range of 0-90° C.

10. The method of claim 9, wherein the reaction temperature for forming the ZnO colloid solution with a smallest particle size is 0-10° C., and the reaction temperature for forming the ZnO colloid solution with a largest particle size is 70-90° C.

11. The method of claim 7, wherein in the mixed solutions, a molar ratio of $OH^-$ to metal ions is 1.5:1-2.5:1.

12. The method of claim 7, wherein:
the alkali includes at least one of lithium hydroxide (LiOH), sodium hydroxide (NaOH), potassium hydroxide (KOH), tetramethylammonium hydroxide (TMAH), ammonia ($NH_3OH$), ethanolamine ($C_2H_7NO$), or ethylenediamine ($C_2H_8N_2$); and/or
the zinc salt includes at least one of zinc acetate ($ZnC_4H_6O_4$), hydrate of $ZnC_4H_6O_4$, zinc nitrate ($Zn(NO_3)_2$), hydrate of $Zn(NO_3)_2$, zinc sulfate ($ZnSO_4$), hydrate of $ZnSO_4$, zinc chloride ($ZnCl_2$), or hydrate of $ZnCl_2$.

13. A light-emitting device comprising:
an anode and a cathode; and
a light-emitting layer and an electron transport layer (ETL) stacked one over another and arranged between the anode and the cathode, the ETL being close to the cathode, and the light-emitting layer being close to the anode;
wherein:
the ETL includes a composite thin film including N thin film layers stacked one over another, N being an integer satisfying $3 \leq N \leq 9$;
the N thin film layers are nano-ZnO thin films; and
a nano-ZnO particle size of the nano-ZnO thin films increases gradually along a direction from the light-emitting layer to the cathode from a first thin film layer close to the light-emitting layer to an N-th thin film layer close to the cathode.

14. The light-emitting device of claim 13, wherein $5 \leq N \leq 7$.

15. The light-emitting device of claim 13, wherein the nano-ZnO particle size of the first thin film layer is 2-3 nm.

16. The light-emitting device of claim 13, wherein the nano-ZnO particle size of the N-th thin film layer is 8-10 nm.

17. The light-emitting device of claim 13, wherein a thickness of each of the nano-ZnO thin films is 10-20 nm.

18. The light-emitting device of claim 13, wherein a total thickness of the composite thin film is 30-180 nm.

19. The light-emitting device of claim 13, wherein the light-emitting layer includes a blue quantum dot (QD) light-emitting layer or a green QD light-emitting layer.

20. The light-emitting device of claim 19, wherein the light-emitting layer, the ETL, and the cathode are stacked one over another and bound one with another.

* * * * *